(12) United States Patent
Schmidt

(10) Patent No.: US 12,313,688 B2
(45) Date of Patent: May 27, 2025

(54) DEVICE AND METHOD FOR CARRYING OUT MEASUREMENTS ON BATTERY CELLS

(71) Applicant: Bayerische Motoren Werke Aktiengesellschaft, Munich (DE)

(72) Inventor: Jan Philipp Schmidt, Holzmaden (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 973 days.

(21) Appl. No.: 17/258,777

(22) PCT Filed: May 20, 2019

(86) PCT No.: PCT/EP2019/062988
§ 371 (c)(1),
(2) Date: Jan. 8, 2021

(87) PCT Pub. No.: WO2020/011435
PCT Pub. Date: Jan. 16, 2020

(65) Prior Publication Data
US 2021/0328277 A1    Oct. 21, 2021

(30) Foreign Application Priority Data
Jul. 11, 2018   (DE) .................. 10 2018 211 508.7

(51) Int. Cl.
*G01R 31/385*   (2019.01)
*G01R 33/36*    (2006.01)
(Continued)

(52) U.S. Cl.
CPC ....... *G01R 31/385* (2019.01); *G01R 33/3628* (2013.01); *H01M 10/48* (2013.01); *H01M 50/569* (2021.01)

(58) Field of Classification Search
CPC ....... G01R 33/3628; G01R 31/36–396; H01M 10/4264; H01M 10/4257; H01M 50/569;
(Continued)

(56) References Cited

U.S. PATENT DOCUMENTS 5,773,978 A * 6/1998 Becker ................. G01R 31/389
340/636.11
8,586,222 B2   11/2013 Timmons et al.
(Continued)

FOREIGN PATENT DOCUMENTS

CN   102216795 A   10/2011
CN   103250301 A   8/2013
(Continued)

OTHER PUBLICATIONS

Chinese-language Office Action issued in Chinese Application No. 201980042461.6 dated Jan. 16, 2024 with English translation (15 pages).

(Continued)

*Primary Examiner* — Lee E Rodak
*Assistant Examiner* — Demetrius R Pretlow
(74) *Attorney, Agent, or Firm* — Crowell & Moring LLP

(57) ABSTRACT

An electrical circuit that enables a determination of a first voltage present inside a battery cell includes an oscillating circuit having a coil and a component, the electrical capacity of which depends on the voltage present on the component, and a reference electrode. The component can be a varactor diode. A method for determining a first voltage which is present within the battery cell and an arrangement having an additional electrical circuit outside the battery cell housing for reading out the first voltage present inside a battery cell are also provided.

3 Claims, 2 Drawing Sheets

(51) Int. Cl.
*H01M 10/48* (2006.01)
*H01M 50/569* (2021.01)

(58) Field of Classification Search
CPC .. H01M 10/40–488; Y02E 60/10; Y02P 70/50
See application file for complete search history.

(56) References Cited

U.S. PATENT DOCUMENTS

| | | | |
|---|---|---|---|
| 11,223,074 B2* | 1/2022 | Remboski | H01M 10/482 |
| 2009/0104510 A1* | 4/2009 | Fulop | H01M 50/553 |
| | | | 429/50 |
| 2011/0210747 A1 | 9/2011 | Heo et al. | |
| 2011/0250478 A1 | 10/2011 | Timmons et al. | |
| 2011/0279122 A1 | 11/2011 | Butzmann | |
| 2013/0002260 A1 | 1/2013 | Golubkov | |
| 2013/0323542 A1 | 12/2013 | Wijayawardhana et al. | |
| 2014/0159735 A1* | 6/2014 | Buzon | G01R 31/392 |
| | | | 324/426 |
| 2018/0062221 A1 | 3/2018 | Koch et al. | |
| 2019/0170831 A1* | 6/2019 | Sada | G01R 31/389 |

FOREIGN PATENT DOCUMENTS

| | | |
|---|---|---|
| DE | 10 2009 000 451 A1 | 7/2010 |
| DE | 10 2013 215 316 A1 | 2/2015 |
| DE | 10 2017 119 602 A1 | 3/2018 |
| JP | 6-233474 A | 8/1994 |
| JP | 2010-218900 A | 9/2010 |
| JP | 2012-516433 A | 7/2012 |
| JP | 2013-137976 A | 7/2013 |
| JP | 2013-222671 A | 10/2013 |
| JP | 2014-523606 A | 9/2014 |
| JP | 2014203658 A * | 10/2014 |
| JP | 2016-76328 A | 5/2016 |

OTHER PUBLICATIONS

Japanese-language Office Action issued in Japanese Application No. 2021-500280 dated Jun. 14, 2023 with English translation (6 pages).
International Search Report (PCT/ISA/210) issued in PCT Application No. PCT/EP2019/062988 dated Sep. 26, 2019, with English translation (five (5) pages).
German-language Written Opinion (PCT/ISA/237) issued in PCT Application No. PCT/EP2019/062988 dated Sep. 26, 2019 (eight (8) pages).
German-language Search Report issued in German Application No. 10 2018 211 508.7 dated Mar. 12, 2019, with partial English translation (19 pages).

* cited by examiner

DEVICE AND METHOD FOR CARRYING OUT MEASUREMENTS ON BATTERY CELLS

BACKGROUND AND SUMMARY OF THE INVENTION

The present invention relates to a device and a method for carrying out measurements on battery cells. The invention particularly relates to the determination of a voltage which is present within a battery cell or battery.

The invention is particularly employed in vehicle batteries (and the battery cells contained therein) wherein this can involve, for example, a high-voltage store which is employed for the propulsion of the vehicle, but also conventional vehicle batteries, which are not designed for the actual propulsion of the vehicle but which permit, for example, the start-up of a combustion engine of the vehicle. Although the employment thereof in conjunction with vehicle batteries is preferred, the invention is not necessarily limited in this regard and, in principle, can also be employed in other batteries and battery cells.

For various reasons, it is frequently desirable to determine the voltage of a battery cell or the half-cell potential of a half-cell in a battery cell. It is already known that, for this purpose, one or more reference electrodes can be incorporated in the battery cell, such that the battery cell can be operated more securely, and also operated in the interests of a higher capacity and—in the event of the employment thereof in a drive for a motor vehicle—a greater range. In the operation of these reference electrodes, superior results are obtained if the input current of the measuring device is low, as it is otherwise possible that the potential will not remain stable, and the reference electrode will drift. In order to resolve this issue, U.S. Pat. No. 8,586,222, for example, proposes an electrode array having a plurality of reference electrodes.

The inventor of the present invention has observed that, in previously known applications, in which a reference electrode or a plurality of reference electrodes are employed for determining a voltage within a battery cell, an additional terminal is required, i.e. additionally to the two terminals (positive and negative poles of the battery cell) which are normally present. In this connection, the inventor has observed that, for the additional terminal, it is also necessary for an additional electrical connection to be routed through the battery housing, such that the read-out of the voltage in the interior of the battery cell, which is to be determined by the reference electrode, is possible by means of appropriate circuitry or measuring devices, externally to the battery cell. In this connection, the inventor has further observed that the additional electrical connection through the battery cell housing can result in higher housing costs, a weakening of the housing and an increased spatial requirement. Particularly in the case of a reference electrode array (as disclosed in U.S. Pat. No. 8,586,222), it is necessary for the individual reference electrodes in the array to be individually actuated and recharged such that, in this case, even a plurality of electrical connections through the battery cell housing are required.

In this context, the object of the invention is the provision of an alternative, and particularly an improved device, and of an alternative, and particularly an improved method for determining a voltage which is present within a battery cell.

According to the invention, this object is fulfilled by an electrical circuit, a battery cell, an assembly, a battery and a method having the features of the respective independent patent claims. Advantageous embodiments of the invention are the subject matter of the dependent patent claims, the description and the figures.

A first aspect of the invention relates to an electrical circuit, which enables a determination of a first voltage present within a battery cell, the electrical circuit including an oscillating circuit, having a coil and a component, the electrical capacitance of which is dependent upon a voltage which is present on said component, and a reference electrode, wherein the electrical circuit is designed to be arranged within a housing of the battery cell, such that the first voltage, which is present between a battery cell electrode and the reference electrode, is at least partially present on the component, and such that a resulting resonant frequency of the oscillating circuit is detectable by means of a magnetic field of the coil, externally to the housing.

Although the circuit is intended for determining a voltage within a battery cell, the circuit can also be provided separately, for subsequent installation in a battery cell.

As the capacitance of the component is dependent upon the voltage which is present thereupon, the resonant frequency of the oscillating circuit can also be dependent upon the voltage which is present on the component, as the resonant frequency of an oscillating circuit is particularly dependent upon the electrical capacitance and the inductance of components within the oscillating circuit. By means of an appropriate read-out circuit, which is particularly arranged externally to the battery cell, the magnetic field of the coil can be detected outside the housing of the battery cell. From the magnetic field detected, the resonant frequency of the oscillating circuit can be determined which, in turn, permits conclusions to be drawn with respect to the voltage which is present on the component. The voltage which is present within the battery cell between a battery cell electrode (anode or cathode) and the reference electrode, described here in the interests of clearer distinction as the "first voltage," is not necessarily directly (and thus in an undivided form) present on the component. Instead, the first voltage can be divided, for example by means of a voltage divider, wherein a proportion of this first voltage is then present on the component. If the ratio by which the first voltage is divided is known, the first voltage can be calculated from the voltage which is determined to be present on the component. Ultimately, it is therefore possible for the magnetic field to be detected externally to the housing of the battery cell, for the resonant frequency of the oscillating circuit to be determined therefrom, for the voltage present on the component to be determined therefrom, and for the first voltage within the battery cell to be determined therefrom. The first voltage thus determined can then be employed for battery (cell) management, for example, in order to prevent an overcharging of the battery cell, to control a charging of the battery cell, to monitor the state of charge of the battery cell, etc.

According to one embodiment, the component comprises a diode, particularly a varactor diode.

A varactor diode is particularly suitable for a circuit according to the invention in that, firstly, it assumes a capacitance which is dependent upon the voltage applied and, secondly, the diode behavior can advantageously be employed for a recharging of the reference electrode, as described in greater detail hereinafter. Other components, the capacitance of which is dependent upon a voltage which is present on the component, would also be conceivable.

According to one embodiment, the oscillating circuit comprises a capacitor, which is connected in series with the component. This appropriately prevents a potential short-circuit via the coil of the oscillating circuit.

According to one embodiment, a half-cell potential of a material of the reference electrode incorporates a plateau. As a result, stable operation can be achieved over relatively wide state of charge ranges.

According to one embodiment, the reference electrode can comprise, for example, one or more of the following materials: transition metal oxides such as, e.g. $LiCoO_2$, mixed oxides such as, e.g. $LiNi_{1-y}Co_yO_2$, phosphates such as, e.g. $LiMPO_4$, wherein M can be, for example, Fe, Mn or Co metals and particularly lithium iron phosphate, lithium titanate, lithium manganese phosphate, lithium-gold alloy, or lithium-aluminum alloy.

The half-cell potential of such materials incorporates a plateau which is appropriate for the present invention.

A second aspect of the invention relates to a battery cell including a first battery cell electrode and a second battery cell electrode, within a housing of the battery cell, and likewise within the housing of the battery cell, an electrical circuit of the above-mentioned type, wherein the oscillating circuit is connected to the first battery cell electrode and the reference electrode such that a first electrical contact of the component is electrically connected to the first battery cell electrode, and a second electrical contact of the component is electrically connected to the reference electrode.

In a battery cell of this type, the above-mentioned "first voltage" would be present between the first battery cell electrode and the reference electrode.

According to one embodiment, a resistor is electrically connected between the oscillating circuit and the first battery cell electrode, or between the oscillating circuit and the reference electrode.

By means of this resistor, current flowing through the reference electrode can be limited. For this reason, optionally, the employment of a high-impedance resistor is recommended, for example, in the megaohm range.

According to one embodiment, a first battery cell contact, which is accessible from the exterior of the battery cell, is electrically connected to the first battery cell electrode by a first electrical connection, which is routed through the housing of the battery cell, a second battery cell contact, which is accessible from the exterior of the battery cell, is electrically connected to the second battery cell electrode by a second electrical connection, which is routed through the housing of the battery cell, and no further electrical connections are routed through the housing of the battery cell.

Accordingly, the housing of a battery cell of this type is not weakened by additional electrical connections through the housing.

A third aspect of the invention relates to an assembly for determining a first voltage which is present within a battery cell, the assembly including a battery cell of the above-mentioned type, a further electrical circuit, which is at least partially arranged externally to the battery cell housing and is designed, by means of the magnetic field of the coil, to detect the resonant frequency of the oscillating circuit.

As the further electrical circuit can detect the resonant frequency of the oscillating circuit by means of the magnetic field of the coil, the first voltage can ultimately be "read out" such that information, for example, regarding the state of charge of the battery cell, is made accessible externally to the battery cell.

According to one embodiment, the electrical circuit and the further electrical circuit are electrically insulated from one another. By the term "electrically insulated from one another" it is preferably to be understood that the electrical circuit and the further electrical circuit are not directly connected to one another, i.e., that these circuits essentially exert a mutual influence upon one another by magnetic coupling only. However, a connection of the electrical circuit naturally exists with other parts of the battery cell, particularly with the first battery cell electrode, and the further electrical circuit, for example, in the employment thereof in a vehicle, can be operated by means of the same (vehicle) battery (cell) such that, via this path, an indirect electrical connection exists between the electrical circuit and the further electrical circuit.

A fourth aspect of the invention relates to a battery, including two or more battery cells of the above-mentioned type, or two or more assemblies of the above-mentioned type.

A fifth aspect of the invention relates to a method for determining a first voltage which is present within a battery cell, the method including the provision of an assembly of the above-mentioned type, detection of the resonant frequency of the oscillating circuit by the further electrical circuit, by means of the magnetic field of the coil, and determination of the first voltage which is present within the battery cell, on the basis of the detected resonant frequency of the oscillating circuit.

Advantageous configurations and forms of embodiment, and the advantages thereof, presented with reference to one of the aspects of the invention (electrical circuit, battery cell, assembly, battery and method) also apply correspondingly, according to the invention, to the other aspects of the invention.

Further advantages, features and potential applications of the present invention proceed from the claims, the figures and the description of the figures. All the features and combinations of features indicated in the above description, together with those indicated hereinafter in the description of the figures and/or features and combinations of features represented in the figures only, can not only be implemented in the respective combination indicated, but also in other combinations or in isolation, provided that these combinations are feasible.

The invention is described in greater detail hereinafter with reference to a number of exemplary embodiments and with reference to the attached drawings, wherein functionally equivalent or functionally similar components are identified by the same reference numbers.

BRIEF DESCRIPTION OF THE DRAWINGS

In the drawings, in a partially schematic representation.

DETAILED DESCRIPTION OF THE DRAWINGS

Figure 1:
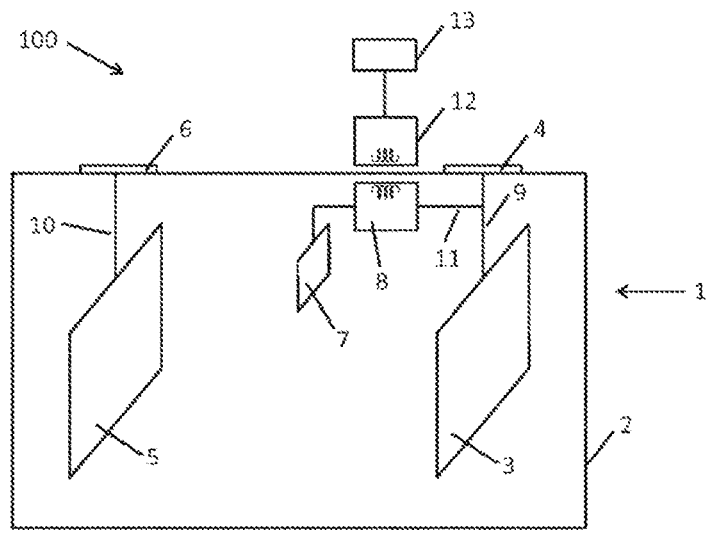
FIG. 1 shows an assembly according to one exemplary embodiment of the present invention.

FIG. 1 shows a simplified representation of an assembly 100 having a battery cell 1 and a read-out circuit 12, which is connected to a battery (cell) management system 13.

The battery cell 1, in this exemplary embodiment, comprises a housing 2, for example, of a plastic material, in order to enclose the interior of the battery cell 1 in an air-tight manner. Within the housing 2, an anode 3 is arranged, which is connected by means of an anode lead 9 to an anode terminal 4. The anode terminal 4 is accessible from the exterior and, for example, is fastened to the surface of the housing 2 and/or at least partially integrated in the housing wall. Parts of the anode lead 9 and/or of the anode terminal 4 thus lead through an opening in the housing 2, such that an electrical connection from the interior of the housing 2 to the space externally to the housing 2 is permitted.

In a similar manner, a cathode 5 is arranged within the housing 2, which is connected to a cathode terminal 6 by means of a cathode lead 10.

The battery cell 1 can be, for example, a lithium-ion battery cell.

Additional to the anode 3 and the cathode 5 (which are frequently also described in combination as working electrodes, main electrodes, or simply as battery cell electrodes), a further electrode is located within the housing 2, namely, a reference electrode 7. This is connected by means of an oscillating circuit 8, which is described in greater detail hereinafter, and a connection lead 11 to the anode 3 or the anode lead 9. The electrical circuit which, in the present example, is comprised of the reference electrode 7, the oscillating circuit 8 and the connection lead 11, constitutes an electrical circuit which permits a determination of a (first) voltage which is present within the battery cell.

In place of the "direct" read-out of the DC voltage of the reference electrode vis-à-vis one of the working electrodes, wherein the reference electrode, as in previously known solutions, is connected to a further (third) terminal externally to the housing, in the present exemplary embodiment, the voltage difference of the reference electrode 7 vis-à-vis one of the working electrodes (in the example according to FIG. 1, the anode 3) is employed for the off-resonance correction of the oscillating circuit 8, or to influence the resonant frequency thereof.

The operating method of the oscillating circuit 8 or the influencing of the resonant frequency by the voltage difference between the reference electrode 7 and the anode 3 is described hereinafter with reference to FIGS. 2 and 3.

As represented in FIG. 1, a further electrical circuit, namely a read-out circuit 12, is arranged externally to the housing 2 of the battery cell 1. The read-out circuit 12 comprises a circuit which is known per se, by means of which the resonant frequency of the oscillating circuit 8 can be determined by magnetic coupling. In FIG. 1, magnetic coupling is symbolized by two coils of the oscillating circuit 8 or of the read-out circuit 12, arranged in mutual opposition. These coils are arranged as close as possible to one another, such that sufficient magnetic coupling is permitted.

From the resonant frequency of the oscillating circuit 8, which is detected by means of the read-out circuit 12, the voltage difference between the reference electrode 7 and the anode 3 can be determined. If the electrical characteristics of the components of the oscillating circuit 8 and, optionally, also of the reference electrode 7 are known, it is possible for the mathematical relationship between the resonant frequency determined and the voltage difference between the reference electrode 7 and the anode 3 to be determined in a purely computational/theoretical manner. Alternatively or additionally, however, it is recommended that a calibration operation should also be executed.

Determination of the voltage difference between the reference electrode 7 and the anode 3 from the resonant frequency determined can be executed in the read-out circuit 12, or by means of down-circuit components, for example, of the battery (cell) management system 13. Ultimately, the voltage difference determined between the reference electrode 7 and the anode 3 can be employed by the battery (cell) management system 13 in order to obtain information regarding the state of charge of the battery cell 1. This information can be employed by the battery (cell) management system for various purposes, for example, in order to prevent an overloading of the battery cell 1, to initiate a recharging of the battery cell 1 or to control and, optionally, optimize the employment of the battery cell 1 for its regulation purpose (for example, the propulsion of a vehicle).

Figures 2, 3:
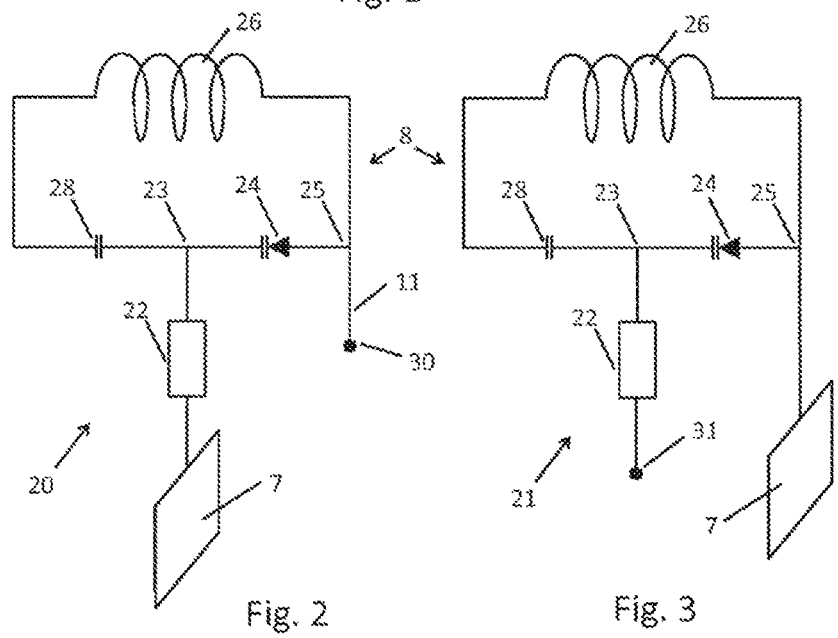
FIG. 2 shows an electrical circuit according to one exemplary embodiment of the present invention.
FIG. 3 shows an electrical circuit according to a further exemplary embodiment of the present invention.

FIG. 2 shows a circuit 20, the upper part of which corresponds to the oscillating circuit 8 according to FIG. 1, and the lower part of which corresponds to the reference electrode 7. The circuit 20 also comprises a resistor 22, which is connected in-circuit between the oscillating circuit 8 and the reference electrode 7.

The oscillating circuit 8 of the circuit 20 comprises a coil 26 and a capacitor 28. The oscillating circuit 8 moreover comprises a further component 24 which, in the example represented, is a varactor diode 24.

The varactor diode 24 is a component, the capacitance of which varies according to a voltage which is present thereupon. In the example according to FIG. 2, this voltage is the voltage between the left-hand terminal of the varactor diode 24 (which is connected to the resistor 22 and the capacitor 28, and is represented by a point 23) and the right-hand terminal of the varactor diode 24 (which is connected to the coil 26, at the point 25). At the point 25, the connection lead 11 according to FIG. 1 is also connected, which terminates at a point 30. This terminal point 30 corresponds to the point in FIG. 1, at which the connection lead 11 is contact-connected with the anode lead 9.

If the circuit 20 according to FIG. 2 is employed in a battery cell 1, as represented in FIG. 1 (i.e. is arranged within the battery cell housing 2 and connected by means of the point 30 to the anode lead 9), a voltage difference is present between the reference electrode 7 and the point 30 (the "first voltage"). A proportion of this first voltage, depending upon the rating of the resistor 22 which, for example, can lie in the megaohm range, is present on the varactor diode 24, i.e., between the points 23 and 25. This voltage, which is present on the varactor diode 24, influences the capacitance of the varactor diode 24, and thus the overall capacitance of the oscillating circuit 8 which, in a manner which is known per se, is constituted of partial capacitances, i.e., in this case, the capacitance of the capacitor 28 and the (instantaneous and variable) capacitance of the varactor diode 24.

As the resonant frequency of the oscillating circuit 8 is dependent upon the overall capacitance and the overall inductance (of the coil 26) of the oscillating circuit 8, this resonant frequency is also dependent upon the voltage difference between the reference electrode 7 and the point 30 or the anode 3. The resonant frequency of the oscillating circuit 8, as described with reference to FIG. 1, can be determined by the further electrical circuit (the read-out circuit 12), from which the voltage difference between the reference electrode 7 and the anode 3 can be determined.

The capacitor 28 prevents a short-circuit of the reference electrode 7 via the resistor 22, the coil 26 and the connection lead 11 to the anode 3. The resistor 22 moreover limits the current flowing through the reference electrode 7.

FIG. 3 shows a circuit 21, which is similar to the circuit 20 represented in FIG. 2. In the upper part of FIG. 3, again, the oscillating circuit 8 can be seen which, in principle, assumes the same function as in FIG. 2. The circuit 21 also comprises a reference electrode 7 and a (potentially high-impedance) resistor 22. By way of distinction from FIG. 2, however, the resistor 22 leads to a point 31, which is provided for connection with the cathode lead 10. The reference electrode 7 is connected to the point 25. In the event of the employment of the circuit 21 in the assembly represented in FIG. 1, corresponding modifications would be undertaken.

As described above, forms of embodiment of the invention can permit a "contactless or wireless" read-out or measurement of the half-cell potential of the reference electrode 7 or of the voltage between the reference electrode 7 and one of the working electrodes. Accordingly, no third terminal for the reference electrode 7 and thus, additionally, no further (third) electrical connection through the housing 2 of the battery cell 1 are required.

In a variant of the circuit according to FIG. 2, it would also be possible, additionally to the resistor 22 or in place of the resistor 22, for a resistor to be connected in-circuit between point 25 and point 30/the anode 3. The same applies correspondingly to the circuit according to FIG. 3, wherein the resistor 22, or an additional resistor might be arranged between the point 25 and the reference electrode 7.

In further variants of the circuits according to FIGS. 2 and 3—depending upon the application—the resistor 22 or an additional resistor might also be omitted.

Appropriate resistance ratings for the resistor 22 or an additional resistor are dictated, for example, by the functions which the resistor 22 or an additional resistor are intended to assume. These functions can particularly involve a limitation of the charging current for the reference electrode 7 and/or the reduction of a leakage current, which has yet to be described. Depending upon the application, potential resistance ratings can differ by a number of orders of magnitude.

By way of non-limiting examples, the following material pairs might be employed for the working electrodes (anode/cathode):

Graphite/NMC (lithium-nickel-manganese-cobalt oxide)
Graphite & silicon/NCA (lithium-nickel-cobalt-aluminum oxide)
Graphite/LCO (lithium-cobalt oxide)

A further advantage of forms of embodiment of the invention is explained by reference to FIG. 4.

Figure 4:
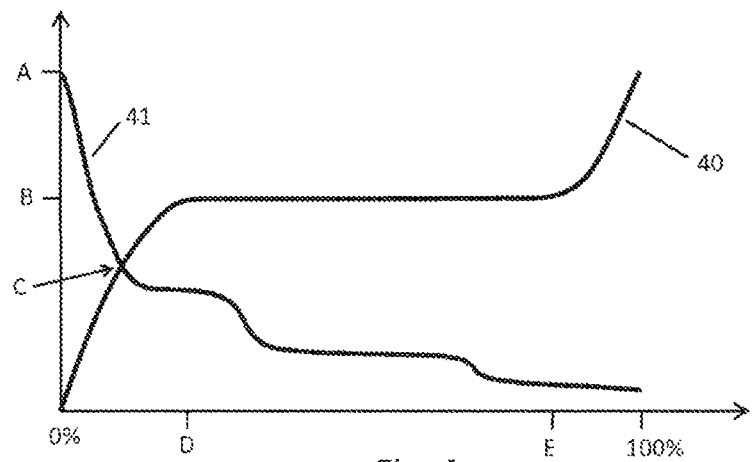
FIG. 4 shows a graphic representation of a half-cell potential for various materials.

FIG. 4 shows a schematic representation of a half-cell potential of two materials, as a function of the state of charge (SOC). The state of charge is plotted on the horizontal axis, in a range from 0% up to a 100% state of charge. The half-cell potential is plotted on the vertical axis, in volts vis-à-vis a lithium half-cell (V vis-à-vis Li). It should be observed that the curves 40 and 41 for the half-cell potential represented in FIG. 4 are only intended to convey a qualitative impression, and are not to be regarded as quantitatively accurate.

The curve 41 represents the half-cell potential for a graphite electrode. This falls from a maximum value A, at a 0% state of charge, to a significantly lower value at a 100% state of charge.

The curve 40 represents the half-cell potential of a reference electrode 7. This rises from a low value (0 volts, or close to 0 volts), at a 0% state of charge, to a value B which is achieved at a state of charge D of the order of 15-20%. Between the state of charge D and a further state of charge E, which can lie between approximately 80-90%, the curve 40 assumes a plateau. In this region, the half-cell potential of the curve 40 remains substantially constant. Beyond the state of charge E, the half-cell potential 40 rises further, up to a maximum value which is achieved at a 100% state of charge.

In order to explain the relevance of the half-cell potential curves according to FIG. 4 to exemplary embodiments according to the present invention, further reference will be made to the above-mentioned U.S. Pat. No. 8,586,222, in which the charging or recharging of a reference electrode is described (and which, in any event, will be familiar to a person skilled in the art).

It is thus assumed that, at a specific time point, the half-cell potential of the reference electrode 7 (curve 40) assumes a value which lies at the maximum value, or close to the maximum value (at the right-hand end of the curve 40). As a result of leakage currents flowing in the varactor diode 24 and/or in the parallel-connected capacitor 28, but also as a result of chemical processes which normally proceed over a period of several days, the state of charge of the reference electrode changes in the direction of 0%, i.e., the half-cell potential of the reference electrode 7 moves slowly to the left along the curve 40. However, over a relatively large region, namely, the region of the plateau (approximately between points D and E), the half-cell potential of the reference electrode 7 remains constant such that, within this region, the half-cell potential of the reference electrode 7 can be employed as a virtually constant reference potential vis-à-vis the anode 3. In this region, the potential of the reference electrode 7 is greater than the potential of the anode 3, such that the varactor diode 24, in the circuit 20 according to FIG. 2, assumes a blocking state. The varactor diode 24 thus functions in the manner of a capacitor, such that the circuit 20 is particularly available for determining the voltage difference between the reference electrode 7 and the anode 3.

If the state of charge of the reference electrode falls further (i.e., the state of charge moves into the region to the left of point D on the curve 40), the half-cell potential of the reference electrode 7 reduces accordingly. However, a 0% state of charge is never achieved, for the following reason: at a point C, the half-cell potential curve 40 of the reference electrode 7 and the half-cell potential curve 41 of the anode 3 intersect. If the half-cell potential of the reference electrode 7 achieves point C (i.e., enters the region to the left of point C), the reference electrode 7 lies at a lower potential than the anode 3. In consequence, the varactor diode 24 assumes a conducting state (see FIG. 2), such that the reference electrode 7 "is recharged." As a result of this recharging, the half-cell potential of the reference electrode 7 returns to a point to the right of point E on the curve 40, and the process can be repeated.

During the recharging of the reference electrode 7, the latter is not available for the delivery of a stable reference potential vis-à-vis the anode 3 (on the grounds that the reference electrode 7 is being recharged by the anode 3). However, this is not considered as a serious disadvantage, on the grounds that, during charging and at higher states of charge of the cell, the functionality of the reference electrode 7 is available (which can be important for example, for the prevention of plating).

Figure 5:
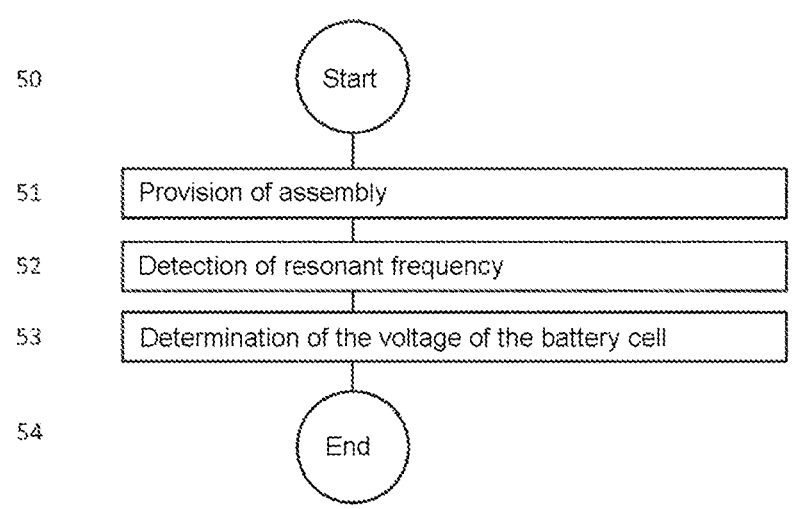
FIG. 5 shows a flow diagram of process steps for a method according to the invention.

FIG. 5 shows a flow diagram, incorporating the process steps of a method according to the invention. Further to the start 50 of the method, one of the above-mentioned assemblies is provided in a step 51. This can be, for example, the assembly according to FIG. 1, wherein this can incorporate the circuit 20 according to FIG. 2 or, further to an appropriate adaptation, the circuit 21 according to FIG. 3, or functionally similar circuits.

Thereafter, in a step 52, the resonant frequency of the oscillating circuit 8 is detected. The read-out circuit 12, optionally in combination with the battery (cell) management system 13 or similar, can be employed for this purpose.

Thereafter, in a further step 53, the voltage of the battery cell 1 is determined on the basis of the resonant frequency detected. Again, this can be executed by means of the read-out circuit 12, the battery (cell) management system 13, or similar. The method ends accordingly (step 54). The voltage determined can then be employed by the battery (cell) management system 13 for the above-mentioned purposes.

By way of an adaptation or extension of the above-mentioned circuits, battery cells, assemblies and method, it is possible for other measured variables which relate to processes or states within the battery cell housing 2 to be determined in a wireless or contactless manner, i.e., made available at a point externally to the battery cell housing 2. To this end, for example, the circuit 20 according to FIG. 2 or the circuit 21 according to FIG. 3 can be adapted such that, in place of the component 24, the capacitance of which is dependent upon a voltage which is present on that component (in the above-mentioned examples, the varactor diode 24), a component is employed, the capacitance of which is dependent upon other measured variables. An alternative component of this type might incorporate, for example, a pressure cell, wherein a prevailing pressure is transmitted to one or both plates of a capacitor. By the variation of pressure in the battery cell 1, the capacitor plate spacing is altered, as a result of which the capacitance of the capacitor changes. The variation in capacitance would, in turn, result in a variation of the resonant frequency of the (adapted) oscillating circuit 8. The altered resonant frequency could then be read-out, as described above.

In a further example, the component 24 might be replaced by a component, the capacitance of which is dependent upon a temperature in the battery cell 1. A component of this type might be provided such that, for example, a temperature variation could result in a change in length of part of this component. This variable-length part might be coupled to one plate of a capacitor, such that a plate spacing of this capacitor is altered in response to a temperature variation. This variation would, in turn, have an influence upon the resonant frequency of the (adapted) oscillating circuit 8, wherein the altered resonant frequency could be read-out as described above.

In the adaptations thus described, of the circuits 20 or 21, in principle, only the oscillating circuit 8 would be necessary, i.e., the reference electrode 7, the resistor 22 and the connection lead 11, either to the anode 3 or to the cathode 5, might be omitted.

Whereas at least one exemplary form of embodiment has previously been described, it should be observed that a large number of variations thereof exist. It should also be observed that the exemplary embodiments described constitute non-limiting examples only, and are not intended to limit the scope, the applicability or the configuration of the devices and methods described herein. Instead, the above description is intended to provide a person skilled in the art with instruction for the implementation of at least one exemplary form of embodiment, wherein it is understood that various changes to the mode of operation and the arrangement of the elements described in an exemplary form of embodiment can be undertaken, with no resulting departure from the respective subject matter defined in the attached claims, or the legal equivalents thereof.

LIST OF REFERENCE SYMBOLS

1 Battery cell
2 Housing
3 Anode
4 Anode terminal
5 Cathode
6 Cathode terminal
7 Reference electrode
8 Oscillating circuit
9 Anode lead
10 Cathode lead
11 Connection lead
12 Read-out circuit
13 Battery (cell) management system
20, 21 Circuit
22 Resistor
23 (Contact) point
24 Component/varactor diode
25 (Contact) point
26 Coil
28 Capacitor
30, 31 (Contact) point
40 Half-cell potential curve of the reference electrode
41 Half-cell potential curve of a (graphite) anode
50-54 Process steps
100 Assembly
A, B Potential level
C Intersection
D, E State of charge

What is claimed is:

1. An electrical circuit which enables a determination of a first voltage present within a battery cell, comprising:
    an oscillating circuit, having a coil and a component, the electrical capacitance of which is dependent upon a voltage which is present on the component, and
    a reference electrode,
    wherein the electrical circuit is arranged within a housing of the battery cell, such that the first voltage, which is present between a battery cell electrode and the reference electrode, is at least partially present on the component, and such that a resulting resonant frequency of the oscillating circuit is detectable by a magnetic field of the coil, externally to the housing;
    wherein a current limiting resistor is electrically connected between the oscillating circuit and the reference electrode; and
    wherein the oscillating circuit comprises a capacitor, which is connected in series with the component, the component comprises a varactor diode, and the capacitor and the varactor diode are connected in parallel with the coil.

2. The electrical circuit according to claim 1, wherein a half-cell potential of a material of the reference electrode incorporates a plateau.

3. The electrical circuit according to claim 1, wherein the reference electrode comprises at least one of lithium iron phosphate, lithium titanate, lithium manganese phosphate, and lithium-gold alloy.

* * * * *